US007965212B1

(12) United States Patent
Turner

(10) Patent No.: US 7,965,212 B1
(45) Date of Patent: Jun. 21, 2011

(54) DAC CIRCUIT USING SUMMING JUNCTION DELAY COMPENSATION

(75) Inventor: Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 12/704,889

(22) Filed: Feb. 12, 2010

(51) Int. Cl.
*H03M 1/66* (2006.01)

(52) U.S. Cl. ........ 341/144; 341/118; 341/119; 341/145; 341/153

(58) Field of Classification Search .......... 341/118–121, 341/144–154
See application file for complete search history.

(56) References Cited

U.S. PATENT DOCUMENTS

| | | | | | |
|---|---|---|---|---|---|
| 2,827,233 | A | * | 3/1958 | Johnson et al. | 341/139 |
| 4,405,916 | A | * | 9/1983 | Hornak et al. | 341/118 |
| 4,751,497 | A | * | 6/1988 | Torii | 341/154 |
| 6,198,419 | B1 | * | 3/2001 | Wen | 341/145 |
| 6,331,830 | B1 | | 12/2001 | Song et al. | |
| 6,906,652 | B2 | * | 6/2005 | Bugeja | 341/145 |
| 6,992,609 | B1 | * | 1/2006 | Zelenin et al. | 341/144 |
| 7,256,720 | B2 | * | 8/2007 | Fukuda | 341/143 |
| 7,342,528 | B2 | * | 3/2008 | Ng et al. | 341/153 |
| 7,528,754 | B1 | * | 5/2009 | Bakkaloglu et al. | 341/143 |
| 7,542,812 | B2 | | 6/2009 | Stroili et al. | |
| 7,565,392 | B2 | | 7/2009 | Turner | |

OTHER PUBLICATIONS

Manandhar et al, A 20-GHz and 46-GHz, 32x6-bit ROM for DDS Application in InP DHBT Technology, IEEE, 2006, pp. 1003-1006.
Manandhar et al, 36-GHz, 16x6-Bit ROM in InP DHBT Technology Suitable for DDS Application, IEEE Journal of Solid-State Circuits, Feb. 2007, pp. 451-456, vol. 42, No. 2.

Murphy et al., All About Direct Digital Synthesis, Analog Dialogue 38-08, Aug. 2004, pp. 1-5, http://www.analog.com/analogdialogue.
Semiconductor device fabrication, Wikipedia, Feb. 8, 2010, pp. 1-7, http://en.wikipedia.org/wiki/Semiconductor_device_fabrication.
Turner et al, 4-Bit Adder-Accumulator at 41-GHz Clock Frequency in InP DHBT Technology, IEEE Microwave and Wireless Components Letters, Mar. 2005, pp. 144-146, vol. 15, No. 3.
Turner et al., Benchmark Results for High-Speed 4-bit Accumulators Implemented in Indium Phosphide DHBT Technology, IEEE Lester Eastman Conference on High Performance Devices, Rensselaer Polytechnic Institute, Aug. 4-6, 2004, pp. 1-16.
Turner et al., Direct Digital Synthesizer With ROM-Less Architecture at 13-GHz Clock Frequency in InP DHBT Technology, IEEE Microwave and Wireless Components Letters, May 2006, pp. 296-298, vol. 16, No. 5.
Turner et al., Direct Digital Synthesizer With Sine-Weighted DAC at 32-GHz Clock Frequency in InP DHBT Technology, IEEE Journal of Solid-State Circuits, Oct. 2006, pp. 2284-2290, vol. 41, No. 10.
Turner, Steven Eugene, High-Speed Digital and Mixed-Signal Components for X- and KU-Band Direct Digital Synthesizers in Indium Phosphide DHBT Technology, A Thesis, May 2006, 172 pages.
Turner et al., ROM-Based Direct Digital Synthesizer at 24 GHz Clock Frequency in InP DHBT Technology, IEEE Microwave and Wireless Components Letters, Aug. 2008, pp. 566-568, vol. 18, No. 8.

* cited by examiner

*Primary Examiner* — Linh V Nguyen
(74) *Attorney, Agent, or Firm* — Neil F. Maloney

(57) ABSTRACT

Techniques are disclosed for improving the dynamic performance of digital-to-analog converters (DAC), by compensating for the unique delay characteristics of each bit in the DAC summing junction to equalize the delays. In one example case, a DAC device is provided that includes a plurality of current sources and a plurality of switches, each switch operatively coupled between a corresponding one of the current sources and a summing junction that is operatively coupled to an analog output. The device further includes a plurality of switch control lines configured to receive a digital input, each switch control line for controlling a corresponding one of the switches. The device further includes a plurality of compensation delay elements, each associated with a corresponding one of the switch control lines and providing a different delay value.

20 Claims, 6 Drawing Sheets

DAC CIRCUIT USING SUMMING JUNCTION DELAY COMPENSATION

STATEMENT OF GOVERNMENT INTEREST

The invention was made with United States Government support under contract DAAD17-02-C-0115 awarded by the Army, and the United States Government has certain rights in this invention.

FIELD OF THE DISCLOSURE

The disclosure relates to signal processing, and more particularly, to digital to analog signal conversion.

BACKGROUND

Direct digital synthesizers (DDS) include a phase accumulator, a phase-to-amplitude converter, and a digital-to-analog converter (DAC). In high-speed applications, these functional blocks are generally clocked with pipeline registers internal to each block. Typical DAC circuits employed in DDS applications generally suffer from poor dynamic performance. These DAC circuit performance issues may further apply in numerous other high-speed applications.

SUMMARY

One embodiment of the present invention provides a digital-to-analog converter device. The device includes a plurality of current sources, and a plurality of switches, each switch operatively coupled between a corresponding one of the current sources and a summing junction that is operatively coupled to an analog output. The device further includes a plurality of switch control lines configured to receive a digital input, each switch control line for controlling a corresponding one of the switches. The device further includes a plurality of compensation delay elements, each associated with a corresponding one of the switch control lines and providing a different delay value. In one particular configuration, the summing junction is associated with parasitic delay that causes a plurality of unequal delay paths between the digital input and the analog output, and the compensation delay elements equalize those delay paths within a given tolerance. In another particular configuration, all switching caused by the digital input impacts the output substantially simultaneously. In another particular configuration, all switching caused by the digital input impacts the output within a window of 400 femtoseconds or less. In another particular configuration, all switching caused by the digital input impacts the output within a window of 200 femtoseconds or less. In another particular configuration, each of the compensation delay elements is implemented with a transmission line configured to provide a desired amount of delay. In one such case, each of the transmission lines is one of a microstip, meanderline, or waveguide. In another particular configuration, each of the compensation delay elements includes one or more logic gates configured to provide a desired amount of delay. In one such case, each of the compensation delay elements further includes one or more multiplexers. In another particular configuration, the device is included in a system-on-chip configuration.

A number of variations will be apparent in light of this disclosure. For instance, another embodiment of the present invention provides a DAC device that includes a plurality of current sources, and a plurality of switches, each switch operatively coupled between a corresponding one of the current sources and a summing junction that is operatively coupled to an analog output. The device further includes a plurality of switch control lines configured to receive a digital input, each switch control line for controlling a corresponding one of the switches. The device further includes a plurality of compensation delay elements, each associated with a corresponding one of the switch control lines and providing a different delay value, wherein each of the compensation delay elements is implemented with a transmission line configured to provide a desired amount of delay. The summing junction is associated with parasitic delay that causes a plurality of unequal delay paths between the digital input and the analog output, and the compensation delay elements equalize those delay paths within a given tolerance. In one particular configuration, all switching caused by the digital input impacts the output substantially simultaneously. In another particular configuration, all switching caused by the digital input impacts the output within a window of 400 femtoseconds or less. In another particular configuration, all switching caused by the digital input impacts the output within a window of 200 femtoseconds or less. In another particular configuration, each of the transmission lines is a microstip.

Another embodiment of the present invention provides a DAC device that includes a plurality of current sources, and a plurality of switches, each switch operatively coupled between a corresponding one of the current sources and a summing junction that is operatively coupled to an analog output. The device further includes a plurality of switch control lines configured to receive a digital input, each switch control line for controlling a corresponding one of the switches. The device further includes a plurality of compensation delay elements, each associated with a corresponding one of the switch control lines and providing a different delay value, wherein each of the compensation delay elements includes one or more logic gates configured to provide a desired amount of delay. The summing junction is associated with parasitic delay that causes a plurality of unequal delay paths between the digital input and the analog output, and the compensation delay elements equalize those delay paths within a given tolerance. In one particular configuration, all switching caused by the digital input impacts the output substantially simultaneously. In another particular configuration, all switching caused by the digital input impacts the output within a window of 400 femtoseconds or less. In another particular configuration, all switching caused by the digital input impacts the output within a window of 200 femtoseconds or less. In another particular configuration, each of the compensation delay elements further includes one or more multiplexers.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
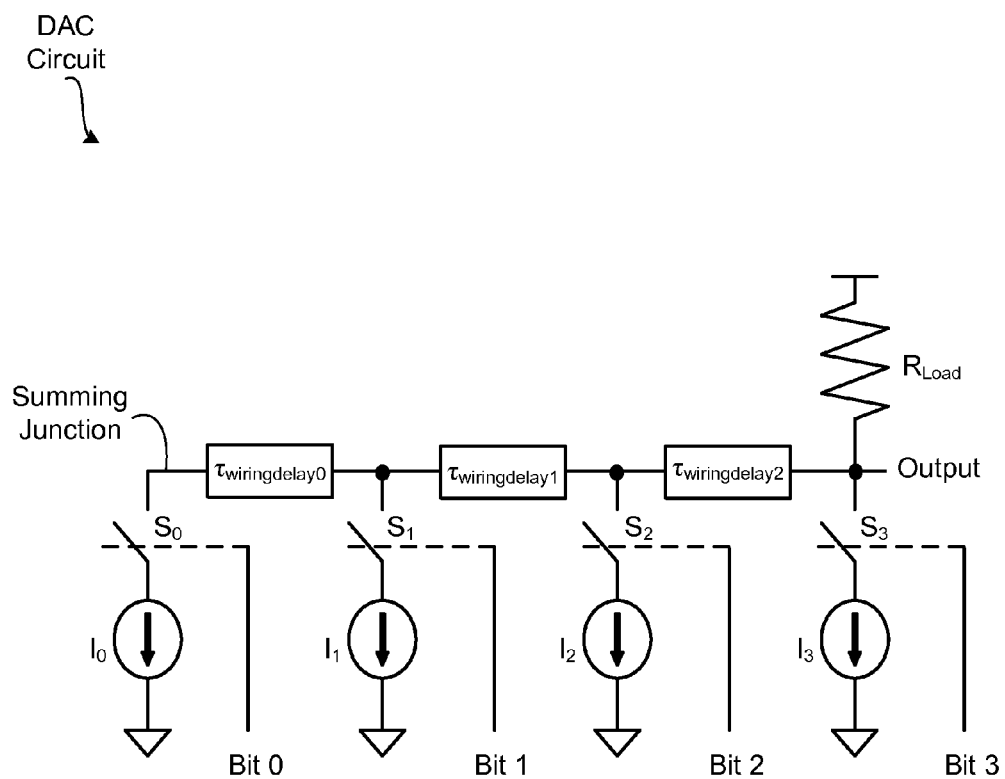
FIG. 1 is a schematic diagram of a typical DAC circuit, and shows how the effective delay time of each input bit node can be different with respect to the DAC output node.

Techniques are disclosed for improving the dynamic performance of digital-to-analog converters (DAC), by compensating for the unique delay characteristics of each bit in the DAC summing junction to equalize the delays. Such parasitic wiring delay causes degradation of spurious-free dynamic range (SFDR), which is a metric of dynamic DAC performance. The DAC may be implemented, for example, either as part of a direct digital synthesis (DDS) system or as a stand-alone circuit having numerous applications. The techniques can be employed, for instance, in a system implemented in semiconductor materials (system-on-chip, or chip set) or with discrete components on a printed circuit board. This delay compensation effectively accounts for variations in propagation delays due to process variations.

General Overview

As previously explained, typical DAC circuits employed in DDS applications generally suffer from poor dynamic performance. One subtle but non-trivial problem is that high-speed DAC summing junctions have delay from bit to bit due to wiring parasitics on the summing junction. Although the delay from the parasitics does not impact traditional static DAC metrics such as integrated non-linearity and differential non-linearity, the delay can affect dynamic DAC performance metrics such as signal to noise ratio (SNR) and SFDR.

In more detail, for optimal dynamic performance, all of the DAC bit switches should ideally switch synchronously with the clock, and impact the DAC output node at the same time (or within a negligible tolerance of one another). However, parasitic wiring delays cause the effective delay time of each input bit node to be different with respect to the DAC output node. This problem is demonstrated in FIG. 1, which illustrates a schematic diagram of a typical DAC circuit.

This example DAC configuration includes a 4-bit input (Bit 0, Bit 1, Bit 2, and Bit 3) and the corresponding current sources ($I_0$, $I_1$, $I_2$, and $I_3$) and switches ($S_0$, $S_1$, $S_2$, and $S_3$), with each switch $S_0$, $S_1$, $S_2$, and $S_3$ connected to a summing junction as commonly done. In operation, each 4-bit digital signal at the DAC input is converted to an analog current at the summing junction and provided at the DAC output. Although a 4-bit resolution is shown, the resolution can be decreased/increased as needed (by subtracting/adding input bits and corresponding switched current sources). Such switched current source DAC configurations can drive a resistive load ($R_{Load}$) directly, and are particularly suitable for high speed applications.

Also shown in the schematic are various parasitic wiring delays ($\tau_{wiringdelay0}$, $\tau_{wiringdelay1}$, and $\tau_{wiringdelay2}$) associated with the summing junction. Each wire delay is associated with one or more input bits. For example, if Bit 0 and Bit 2 were switched simultaneously (such that $S_0$ and $S_2$ are closed thereby activating current sources $I_0$ and $I_2$), the effect of Bit 0 on the DAC output would occur $\tau_{wiringdelay0}+\tau_{wiringdelay1}$ after the effect of Bit 2 on the DAC output. Table 1 demonstrates the wire delays associated with each of the bits in one such example case.

TABLE 1

| Wiring delays associated with each bit | |
|---|---|
| Bit | Summing Junction Wiring Delays |
| 0 | $\tau_{wiringdelay0}$, $\tau_{wiringdelay1}$, $\tau_{wiringdelay2}$ |
| 1 | $\tau_{wiringdelay1}$, $\tau_{wiringdelay2}$ |
| 2 | $\tau_{wiringdelay2}$ |
| 3 | none |

These uneven summing junction delays contribute to poor dynamic performance of the DAC.

As such, and in accordance with an embodiment of the present invention, the DAC performance can be improved, based on for example dynamic SNR and/or SFDR metrics of the DAC, can be improved by compensating for the parasitic wiring delays ($\tau_{wiringdelay0}$, $\tau_{wiringdelay1}$, and $\tau_{wiringdelay2}$) up to the current switches ($S_0$, $S_1$, $S_2$, and $S_3$) of the DAC. This compensation can be provided, for example, using transmission lines on each bit/switch control line or other suitable delay mechanisms that can be deployed to equalize the overall delay associated with each bit/control line. In any case, the compensation allows switches $S_0$, $S_1$, $S_2$, and $S_3$ to impact the output node simultaneously (or otherwise within an acceptable tolerance of one another, such that all switching caused by the digital input impacts the output within a given time window).

Parasitic Wiring Delay Compensation

Figure 2:
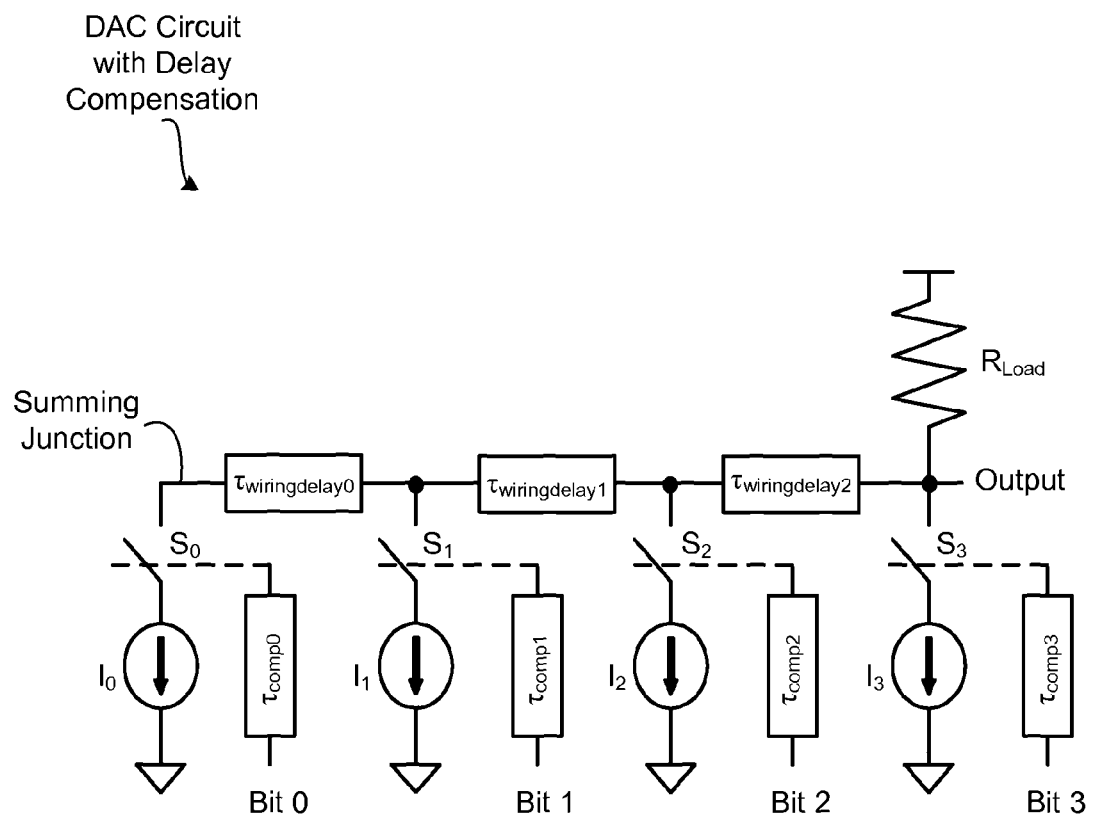
FIG. 2 is a schematic diagram of a DAC circuit that is configured to equalize or otherwise compensate for unequal delay times of each input bit node with respect to the DAC output node, in accordance with one embodiment of the present invention.

FIG. 2 is a schematic diagram of a DAC circuit configured with delay compensation elements to equalize or otherwise compensate for unequal delay times of each input bit node with respect to the DAC output node, in accordance with one embodiment of the present invention. In this particular example, a delay compensation element is added to each bit switch control input to compensate for parasitic wiring delays ($\tau_{wiringdelay0}$, $\tau_{wiringdelay1}$, and $\tau_{wiringdelay2}$) in the summing junction, so that all bit switching impacts the output node substantially simultaneously.

As can be seen, the example DAC circuit with delay compensation can be implemented in a similar fashion as the DAC circuit shown in FIG. 1, except for the addition of the delay compensation elements ($\tau_{comp0}$, $\tau_{comp1}$, and $\tau_{comp2}$), which shall be discussed in turn. The previous discussion with respect to typical DAC circuit components such as the 4-bit input (Bit 0, Bit 1, Bit 2, and Bit 3), current sources ($I_0$, $I_1$, $I_2$, and $I_3$), switches ($S_0$, $S_1$, $S_2$, and $S_3$), and parasitic wiring delays ($\tau_{wiringdelay0}$, $\tau_{wiringdelay1}$, and $\tau_{wiringdelay2}$), is equally applicable here.

As will be appreciated, any number of input bits (DAC resolution) can be used in conjunction with the bit delay compensation scheme provided herein. The DAC configuration may vary as well. For instance, in some embodiments, the DAC circuit with delay compensation may be implemented as a binary-weighted DAC (e.g., R-2R ladder DAC), or a thermometer-coded DAC, or a combination thereof. In general, any DAC circuit configuration that is susceptible to poor dynamic performance due to unequal delay times of each input bit node with respect to the DAC output node can benefit from an embodiment of the present invention.

In accordance with an embodiment of the present invention, switching the input bits with compensating time delays ($\tau_{comp0}$, $\tau_{comp1}$, and $\tau_{comp2}$) in conjunction with the parasitic wiring delays ($\tau_{wiringdelay0}$, $\tau_{wiringdelay1}$, and $\tau_{wiringdelay2}$) on the summing junction equalizes the total delay of any one input bit with respect to any other input bit, and therefore results in all bit switches ($S_0$, $S_1$, $S_2$, and $S_3$) impacting the output node simultaneously (or within a negligible tolerance). For example, if $\tau_{comp0}$ is set equal to 0 and $\tau_{comp3}$ is set to equal to $\tau_{wiringdelay0} + \tau_{wiringdelay1} + \tau_{wiringdelay2}$, then bit 0 and bit 3 will switch simultaneously at the output node, thereby improving dynamic DAC performance, relative to an uncompensated DAC having non-equalized bit (current switch control line) inputs. Table 2 demonstrates the value for each of the compensation elements, in accordance with one example embodiment.

TABLE 2

Delay Value of Compensation Elements

| Bit | Delay Value Equal to: |
|---|---|
| $t_{comp0}$ | 0 |
| $t_{comp1}$ | $\tau_{wiringdelay0}$ |
| $t_{comp2}$ | $\tau_{wiringdelay0}$, $\tau_{wiringdelay1}$ |
| $t_{comp3}$ | $\tau_{wiringdelay0}$, $\tau_{wiringdelay1}$, $\tau_{wiringdelay2}$ |

With respect to bit switches ($S_0$, $S_1$, $S_2$, and $S_3$) impacting the output node simultaneously, it will be appreciated that exactly simultaneously is not necessary and a reasonable or otherwise negligible tolerance can be used. For instance, given a DAC clock speed in the range of 10 GHz to 30 GHz, the bit switches ($S_0$, $S_1$, $S_2$, and $S_3$) will be considered to be impacting the output node simultaneously if they do so within 100 femtoseconds (fs) or less of one another. The tolerance for slower clock speeds may be greater (e.g., <700 femtoseconds), and for faster clocks speeds may be lower (e.g., <50 femtoseconds). In this sense, all switching caused by the digital input (Bit 0, Bit 1, Bit 2, and Bit 3) impacts the output within a predefined time window or less (whether it be a 50 fs, 100 fs, 200 fs, 400 fs, or other suitable window). In a more general sense, any suitable tolerance can be used, so long as the dynamic DAC performance (e.g., SNR and SFDR) is not degraded to unacceptable levels for a given application.

The compensation elements $\tau_{comp0}$, $\tau_{comp1}$, and $\tau_{comp2}$, can be implemented, for example, as transmission lines, such as microstrips, meanderlines, and/or waveguides. Such transmission lines can be fabricated, for instance, during a back-end of a semiconductor process. During the front-end of the process, components such as the transistors, resistors, etc are created. The back-end is where metal interconnects and other metal layers or features (such as the transmission lines or other such delay compensation elements) can be created.

Any number of suitable semiconductor process technologies and material systems can be used in fabricating the DAC circuit with delay compensation. For example, for higher speed applications (e.g., in excess of 10 GHz), the DAC can be implemented, for instance, in heterojunction bipolar transistor (HBT) and/or high electron mobility transistor (HEMT) technology. However, if such high speeds are not necessary (e.g., less than 2 GHz), then other technologies such as complementary metal oxide semiconductor (CMOS) technology can be utilized. Example materials from which the system can be implemented include III-V material systems such as gallium arsenide (GaAs) or indium phosphide (InP), or other suitable semiconductor material systems.

Compensation Delay Elements

Figure 3:
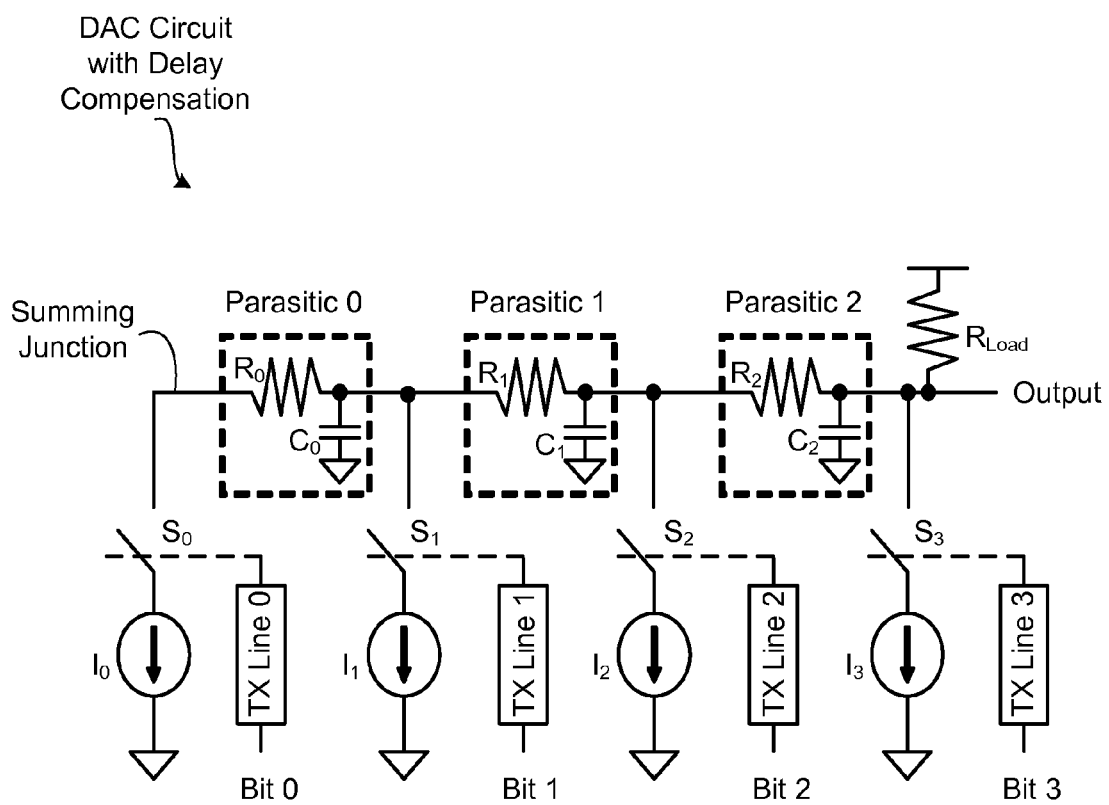
FIG. 3 is a schematic diagram of the DAC circuit shown in FIG. 2, wherein the compensation is provided by transmission lines, in accordance with one embodiment of the present invention.

FIG. 3 is a schematic diagram of the DAC circuit shown in FIG. 2, wherein the compensation is provided by transmission lines (TX line 0, TX line 1, and TX line 2), in accordance with one embodiment of the present invention. The wiring delays in the DAC summing junction are shown as parasitic resistor-capacitor (RC) networks inherent in the wiring (e.g., metallized interconnect structure). As will be appreciated, each inherent RC network is associated with an RC time constant, $\tau$ (tau).

In more detail, parasitic 0 includes the RC time constant of $R_0C_0$, parasitic 1 includes the RC time constant of $R_1C_1$, and parasitic 2 includes the RC time constant of $R_2C_2$. As will further be appreciated, these RC time constants can vary from one DAC design to the next, or even within the same design due to variations in the devices and metallization from circuit to circuit within a single wafer as well as variation between lots of wafers.

In one specific embodiment, the transmission lines TX line 0, TX line 1, and TX line 2 are implemented as microstrips. A specific example transmission line configuration is an aluminum microstrip line that is 2 um to 6 um (e.g., 4 um) tall, 2 um to 8 um (e.g., 5 um) wide, and 1 um to 7 um (e.g., 4 um) above an aluminum ground plane. A dielectric can be deployed between the ground plane and the transmission line, such as polyimide or silicon dioxide or silicon nitride or benzocyclobutene or other suitable dielectric materials. Typical transmission line and ground plane materials include, for example, copper, gold, and aluminum.

In other embodiments, and as previously explained, the transmission lines TX line 0, TX line 1, and TX line 2 can be implemented with other suitable transmission line types, such as meanderlines or waveguides. Alternatively, the compensation delay provided by the transmission lines TX line 0, TX line 1, and TX line 2 in this example embodiment could be provided by one or more active devices such as unity gain buffer or other logic gate configuration. In general, any device that provides a desired amount or unit of propagation delay can be used as a delay compensation element, in accordance with an embodiment of the present invention.

In an integrated circuit application, the transmission lines TX line 0, TX line 1, and TX line 2 (or other suitable compensation delay elements) can be implemented in the back-end process (e.g., during formation of the DAC interconnect structure). Alternatively, in an embodiment where the compensation delay element is a buffer or other active device, those compensation delay elements can be provided in the front-end of the process (e.g., along with the current switches etc). A serial path of such active devices can be provided, with each device providing a unit of delay contributing to the overall desired amount of compensation delay.

The length of each transmission line TX line 0, TX line 1, and TX line 2 can be varied to achieve the desired compensation delay. The desired length can be determined, for example, using a calibration procedure carried out empirically and/or through simulation. In one such case, pseudo-random binary sequence (PRBS) bit streams can be driven into each of the DAC input bits individually on each current switch to measure the relative delays from the input of each current switch to the overall DAC output. The differences in the delay times can be used to determine the lengths of the transmission lines needed to equalize the delays associated with the current switches. When all of the transmission lines are physically laid-out in design, the layout can be extracted and re-simulated to determine if any additional adjustment/ refining is needed to ensure that the delays are equalized within a given tolerance (e.g., <200 femtoseconds).

As will be appreciated in light of this disclosure, the delay compensation element type, dimensions, and materials can vary from one embodiment to the next, and the claimed invention is not intended to be limited to any particular compensation delay element type/configuration/material system. For example, for integrated DAC circuit applications using transmission lines for the compensation delay elements (such as the example embodiment shown in FIG. 3), the dimension of the compensation delay elements as well as the number of compensation delay elements will depend on factors such as the interconnect layout of the DAC circuit and the desired accuracy of the compensation delay to be provided. In some such applications, the DAC may be implemented, for example, either as part of an overall system-on-chip, where the compensation delay elements are configured to provide a complete on-board compensation scheme for compensating for both on-chip and off-chip delays.

Figure 4A:
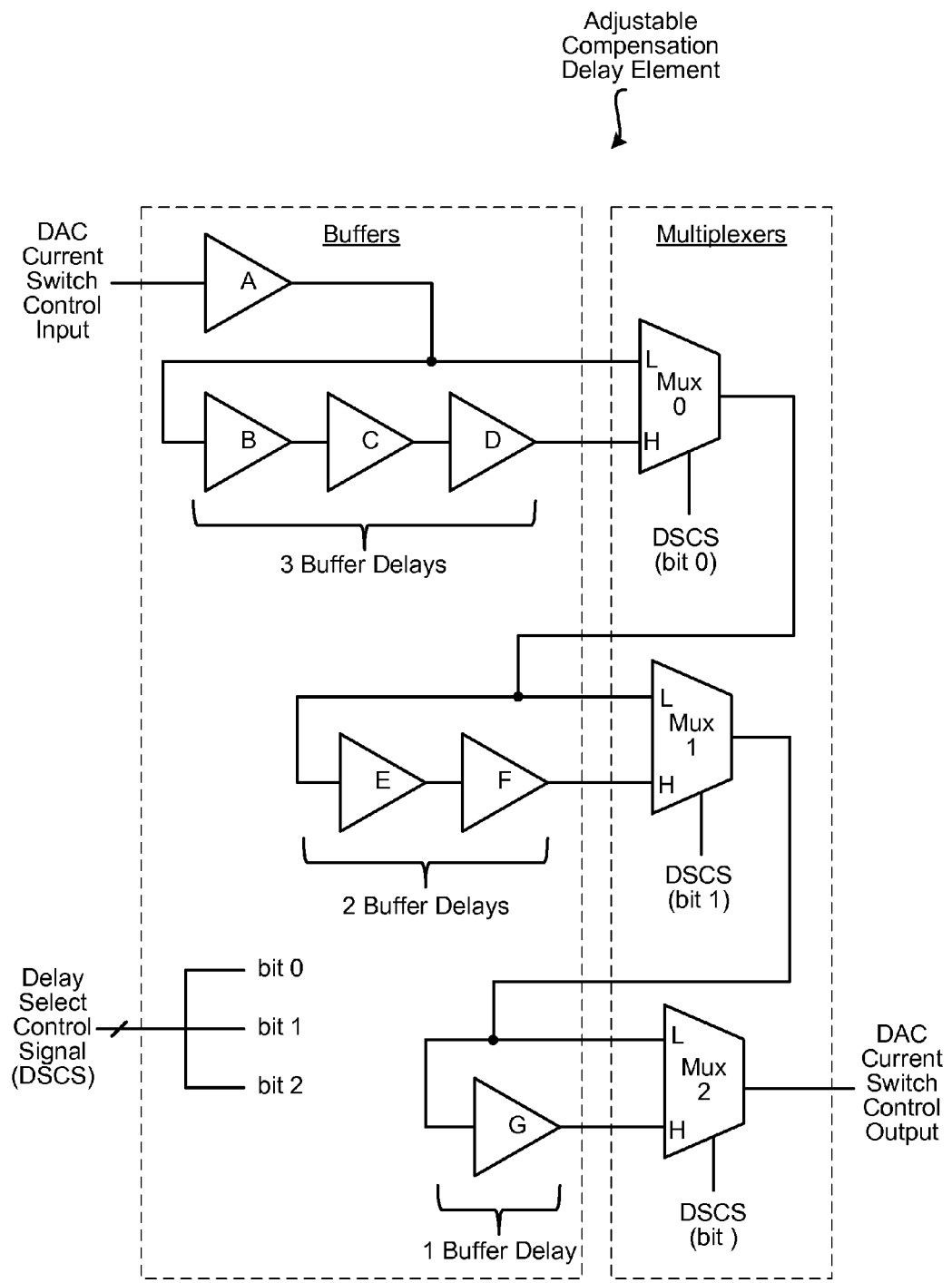
FIG. 4a is a block diagram of an adjustable compensation delay element configured in accordance with one embodiment of the present invention.
Figure 4B:
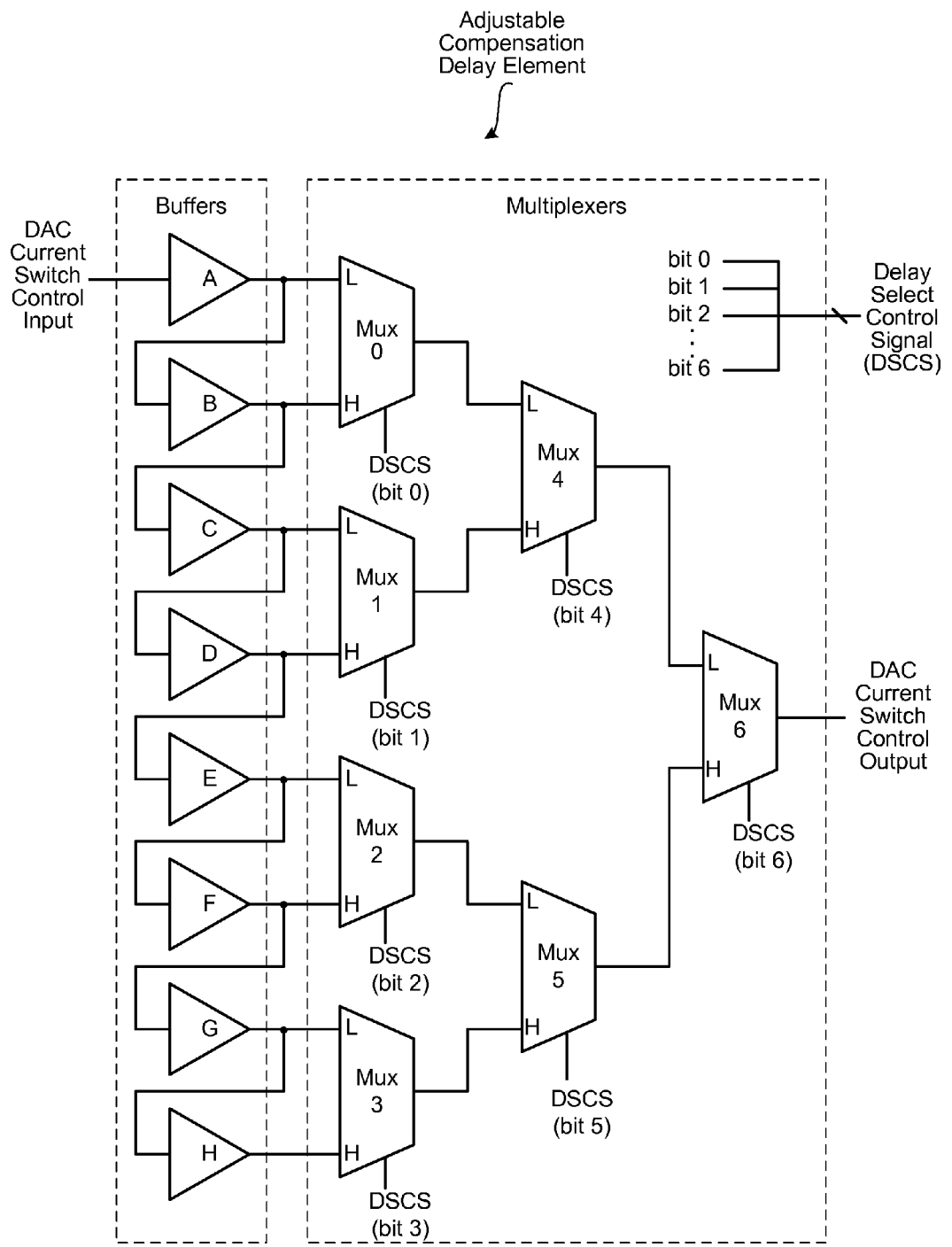
FIG. 4b is a block diagram of an adjustable compensation delay element configured in accordance with another embodiment of the present invention.

In other embodiments, the compensation delay elements can be implemented using serial logic buffers that can be selectively coupled into the DAC bit switch path, such as the example embodiments shown in FIGS. 4a and 4b. In short, an adjustable compensation delay element as shown in FIGS. 4a and 4b can be used to replace each of the transmission line based delay elements shown in FIG. 3. Such programmable delay may be helpful, for instance, for DAC applications subjected to environmental changes (e.g., temperature, humidity, etc) or any other changes that may impact dynamic DAC performance after deployment of the DAC.

FIG. 4a is a block diagram of an adjustable compensation delay element configured in accordance with one embodiment of the present invention. As can be seen, the example adjustable compensation delay element includes seven buffers (A through G) and three multiplexers (Mux 0, Mux 1, and Mux 2). The delay select control signal (DSCS) is 3-bits in this example, such that each of the three muxes is effectively controlled by one bit (i.e., Mux 0 by bit 0, Mux 1 by bit 1, and Mux 2 by bit 2).

This configuration allows for the selection of discrete delay increments, as provided by the buffers A-G. In general, each of the buffers A-G is associated with a fixed propagation delay, which can be exploited to delay the DAC current switch control input by a known amount. The buffers can be implemented with any suitable buffer technology, and in one example case are implemented with unity gain buffers (voltage followers). Other embodiments may utilize buffers having amplifying or attenuating capability, if so desired. The multiplexers Mux 0, Mux 1, and Mux 2 can be implemented, for example, with a conventional high-speed multiplexer circuit design (e.g., such as the SN54/74LS157), and are used to select the desired amount of delay.

In operation, this example adjustable compensation delay element allows for selection of 0 to 6 buffer delays, not counting buffer A (the delay of which is constantly applied). Such an implementation can be used, for instance, to provide full parasitic delay compensation coverage for DAC circuits operating up to 30 GHz. Note, however, that higher operating frequencies can be used by scaling the number of buffers and multiplexers accordingly. Table 3 demonstrates the operation of the adjustable clock delay circuit.

TABLE 3

Adjustable Delay

| Switch Control Delay | Buffers Used | Delay Select Control |||
|---|---|---|---|---|
| | | b2 | b1 | b0 |
| 1 | A | 0 | 0 | 0 |
| 2 | A, G | 1 | 0 | 0 |
| 3 | A, E, F | 0 | 1 | 0 |
| 4a | A, B, C, D | 0 | 0 | 1 |
| 4b | A, E, F, G | 1 | 1 | 0 |
| 5 | A, B, C, D, G | 1 | 0 | 1 |
| 6 | A, B, C, D, E, F | 0 | 1 | 1 |
| 7 | A, B, C, D, E, F, G | 1 | 1 | 1 |

As can be seen, if the DSCS bit is logic 0, then the corresponding multiplexer switches the L input to the multiplexer output, which is effectively a non-delay feed through path (i.e., no buffers on path). However, if the DSCS bit is logic 1, then the corresponding multiplexer switches the H input to the multiplexer output, which will provide a unit of delay for each buffer on that path. A switch control delay of 1 unit (buffer A) is provided for all DSCS. Note that for a delay of 4 units, there are two possible buffer delay paths (generally designated as 4a or 4b in Table 3, where buffers A, B, C, D or A, E, F, G, respectively, are switched into the delay path).

FIG. 4b is a block diagram of an adjustable compensation delay element configured in accordance with another embodiment of the present invention. In this example configuration, the adjustable compensation delay element includes eight buffers (A through H) and seven multiplexers (Mux 0, Mux 1, Mux 2, Mux 3, Mux 4, Mux 5, Mux 6). The delay select control signal (DSCS) is 7-bits in this example, such that each of the seven muxes is effectively controlled by a corresponding one of the seven DSCS bits. This configuration allows for the selection of discrete delay increments, as provided by the buffers A-H, each of which is associated with a fixed propagation delay that can be connected into the delay path by a combination of the multiplexers to delay the DAC current switch control input by a known amount. The previous disclosure with respect to the buffers and multiplexers of FIG. 4a is equally applicable here. This configuration is also scalable to cover additional delays. Table 4 demonstrates the operation of the alternate adjustable clock delay circuit configuration of FIG. 4b.

TABLE 4

Adjustable Delay

| Clock Delay | Buffers Used | Muxes Used | Delay Select Control |||||||
|---|---|---|---|---|---|---|---|---|---|
| | | | b6 | b5 | b4 | b3 | b2 | b1 | b0 |
| 1 | A | 0,4,6 | 0 | 1 | 0 | 1 | 1 | 1 | 0 |
| 2 | A,B | 0,4,6 | 0 | 1 | 0 | 1 | 1 | 1 | 1 |
| 3 | A,B,C | 1,4,6 | 0 | 1 | 1 | 1 | 1 | 0 | 1 |
| 4a | A,B,C,D | 1,4,6 | 0 | 1 | 1 | 1 | 1 | 1 | 1 |
| 4b | A,B,C,D,E | 2,5,6 | 1 | 0 | 1 | 1 | 0 | 1 | 1 |
| 5 | A,B,C,D,E,F | 2,5,6 | 1 | 0 | 1 | 1 | 1 | 1 | 1 |
| 6 | A,B,C,D,E,F,G | 3,5,6 | 1 | 1 | 1 | 0 | 1 | 1 | 1 |
| 7 | A,B,C,D,E,F,G,H | 3,5,6 | 1 | 1 | 1 | 1 | 1 | 1 | 1 |

Just as with the embodiment of FIG. 4a, if the DSCS bit is logic 0, then the corresponding multiplexer switches the L input to the multiplexer output. However, if the DSCS bit is logic 1, then the corresponding multiplexer switches the H input to the multiplexer output. Note that a switch control delay of 1 unit (buffer A) is provided for all DSCS. Further note the layout symmetry and duplicate conductor lengths for each of buffers B-H and muxes 0-6, such that the delay adjustment is predominantly provided by the buffers (rather than the conductors coupling the buffers and muxes from the switch control input to the switch control output).

Delay Select Control Signal (DSCS)

Figure 5A:
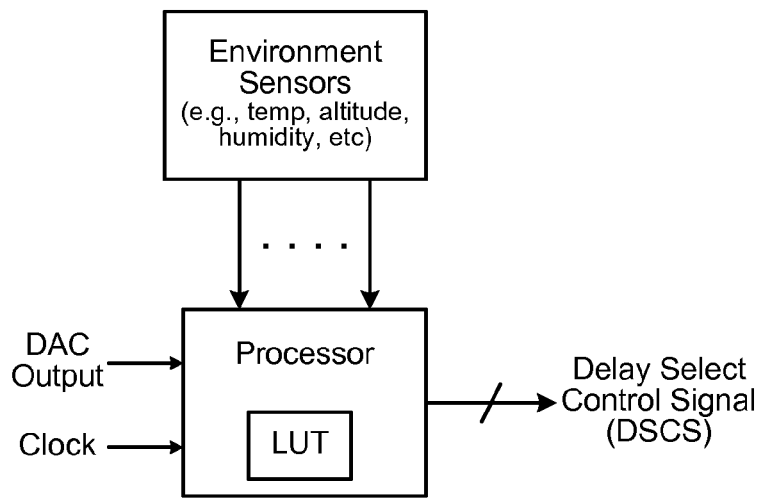
FIG. 5a is a block diagram showing a circuit configured for generating a delay select control signal, in accordance with one embodiment of the present invention.

FIG. 5a is a block diagram showing a circuit configured for generating a delay select control signal, in accordance with one embodiment of the present invention. As can be seen, a processor is configured to receive a DAC clock signal and the DAC output, as well as input from one or more environmental sensors, such as temperature, humidity, altitude, and/or other input characterizing environmental variables that have an impact on DAC performance and a change in which can be sensed. The processor further includes a look-up table (LUT) that includes a plurality of entries, each entry defining a DAC operating parameter set (e.g., clock and/or one or more environmental variables) along with a corresponding delay select control signal (DSCS) that provides optimal timing for the DAC dynamic performance under that operating parameter set. Table 5 illustrates an example LUT. As will be appreciated, the LUT may include any number of entries to provide the resolution needed for the desired degree of accuracy for a given DAC application.

TABLE 5

Example LUT

| Temp | Clock | DSCS b2 | b1 | b0 |
|---|---|---|---|---|
| 20 to 35° C. | 30 GHz | 0 | 0 | 0 |
| 20 to 35° C. | 30 GHz | 0 | 0 | 0 |
| 20 to 35° C. | 30 GHz | 1 | 1 | 0 |
| 20 to 35° C. | 30 GHz | 1 | 1 | 0 |
| 20 to 35° C. | 30 GHz | 1 | 0 | 1 |
| 20 to 35° C. | 30 GHz | 1 | 0 | 1 |
| 20 to 35° C. | 30 GHz | 1 | 0 | 1 |
| 35 to 45° C. | 30 GHz | 0 | 0 | 1 |
| 35 to 45° C. | 30 GHz | 0 | 0 | 1 |
| 35 to 45° C. | 30 GHz | 1 | 1 | 1 |
| 35 to 45° C. | 30 GHz | 1 | 1 | 1 |
| 35 to 45° C. | 30 GHz | 1 | 1 | 0 |
| 35 to 45° C. | 30 GHz | 1 | 1 | 0 |
| 35 to 45° C. | 30 GHz | 1 | 1 | 0 |
| 20 to 35° C. | 40 GHz | 0 | 1 | 1 |
| 20 to 35° C. | 40 GHz | 0 | 1 | 1 |
| 20 to 35° C. | 40 GHz | 0 | 0 | 0 |
| 20 to 35° C. | 40 GHz | 0 | 0 | 0 |
| 20 to 35° C. | 40 GHz | 1 | 1 | 1 |
| 20 to 35° C. | 40 GHz | 1 | 1 | 1 |
| 20 to 35° C. | 40 GHz | 1 | 1 | 1 |
| 35 to 45° C. | 40 GHz | 0 | 1 | 1 |
| 35 to 45° C. | 40 GHz | 0 | 1 | 1 |
| 35 to 45° C. | 40 GHz | 0 | 0 | 0 |
| 35 to 45° C. | 40 GHz | 0 | 0 | 1 |
| 35 to 45° C. | 40 GHz | 0 | 0 | 1 |
| 35 to 45° C. | 40 GHz | 1 | 1 | 1 |
| 35 to 45° C. | 40 GHz | 1 | 1 | 1 |
| 35 to 45° C. | 40 GHz | 1 | 1 | 1 |

The LUT entries can be, for example, empirically developed by manually or automatically testing the given DAC circuit (or system in which the DAC is deployed) for proper operation over a range of DAC operating parameter sets and testing each available corresponding delay select control signal for each DAC operating parameter set, to identify the best performing delay select control signal for a given parameter set. For instance, and with reference to the example of Table 5, if the DAC clock is set to 40 GHz and the operating temperature of the environment in which the DAC is operating is in the range of 35 to 45° C., then a delay select control signal of 011 (assuming a 3-bit DSCS) is the one that provided optimal DAC dynamic performance (for the known set of stimulus) of all the available delay select control signals.

The processor can be implemented with any suitable processor technology, such as a programmable microprocessor or a microcontroller programmed or otherwise configured to carry out the methodologies described herein. For example, a microcontroller configured with a number of input/output ports and a number of embedded routines for interrogating the current DAC operating parameter set and identifying a suitable DSCS. The input ports can each receive a signal indicative of a given operating parameter, and an output port can provide the desired DSCS. The LUT can be stored in a memory on-board or otherwise accessible by the microcontroller. The microcontroller may further include memory (e.g., ROM or flash) for storing the various routines as well as workspace (e.g., random access memory) for executing those routines. Any number of suitable processor configurations can be used.

Figure 5B:
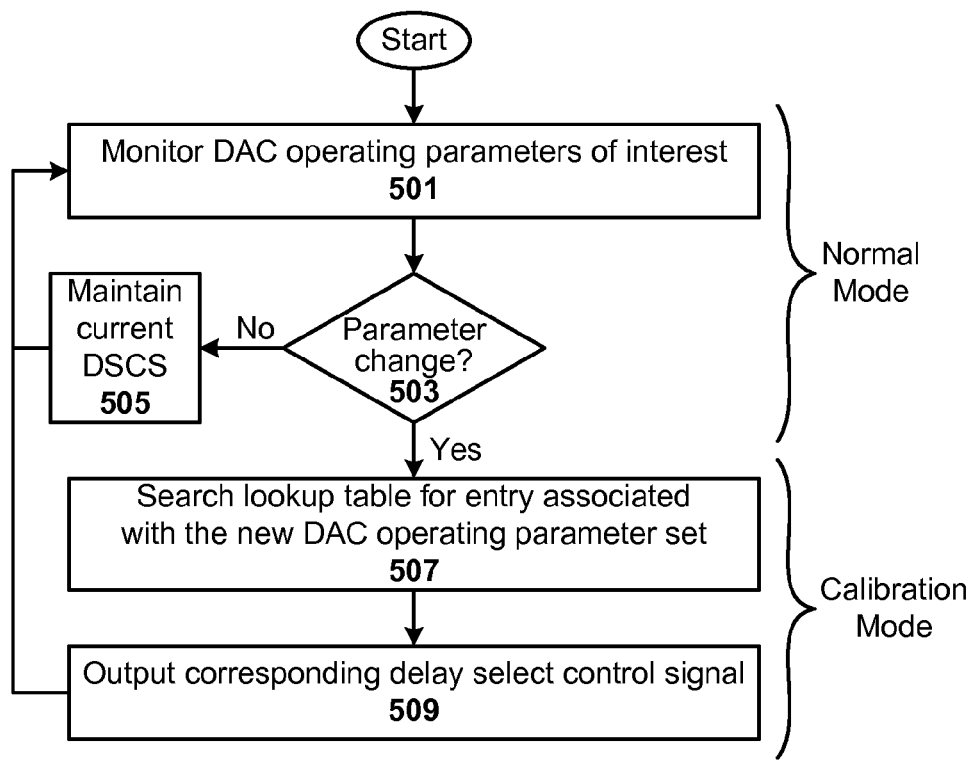
FIG. 5b illustrates a method for generating a delay select control signal, in accordance with one embodiment of the present invention.

FIG. 5b illustrates a method for generating a delay select control signal, in accordance with one embodiment of the present invention. This method can be carried out, for example, by the processor of FIG. 5a. As can be seen, the method includes a mode for normal DAC operation, and a mode for DAC calibration where the delay select control signal is updated based on changes in the DAC operating parameter set. The method includes monitoring 501 DAC operating parameters of interest, such as clock speed and temperature of environment. The method continues with determining 503 if any parameter has changed. In one such example, each parameter can be associated with a pre-defined tolerance range, and any detection that a parameter is outside its tolerance range can be used to indicate a parameter change. Slight parameter changes that occur, but do not cause an out of tolerance reading can be treated as a non-change. If no parameter change is detected, then the method continues with maintaining 505 the current delay select control signal (DSCS). However, if a parameter change is detected, then the method continues with searching 507 a lookup table for an entry associated with the new DAC operating parameter set, and outputting 509 a corresponding delay select control signal associated with the new DAC operating parameter set.

Variations on the example embodiments shown in FIGS. 5a and 5b will be apparent in light of this disclosure. For instance, in another embodiment, rather than using a look-up table populated with empirically developed data, the processor can be programmed to monitor for changes in the DAC operating parameter set, and when such a change is detected, the calibration mode can be entered where known stimulus (clock, temp, etc) are input to the DAC (in the given environment of interest). During calibration mode, the DAC output can be monitored in real-time for accuracy as the available delay select control signals are sequentially cycled through. After all available delay select control signals are tested, the one providing the DAC output closest in value to the desired DAC output value can be used for normal mode operation.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A digital-to-analog converter device, comprising:
a plurality of current sources;
a plurality of switches, each operatively coupled between a corresponding one of the current sources and a summing junction that is operatively coupled to an analog output;
a plurality of switch control lines configured to receive a digital input, each switch control line for controlling a corresponding one of the switches; and
a plurality of compensation delay elements, each associated with a corresponding one of the switch control lines and providing a different delay value, wherein the compensation delay elements equalize unequal delay paths between the digital input and the analog output within a given tolerance, so that all switching caused by the digital input impacts the analog output substantially simultaneously.

2. The device of claim 1 wherein the summing junction is associated with parasitic delay that causes a plurality of the unequal delay paths.

3. The device of claim 1 wherein all switching caused by the digital input impacts the analog output within a window of 100 femtoseconds or less.

4. The device of claim 1 wherein all switching caused by the digital input impacts the analog output within a window of 400 femtoseconds or less.

5. The device of claim 1 wherein all switching caused by the digital input impacts the analog output within a window of 200 femtoseconds or less.

6. The device of claim 1 wherein each of the compensation delay elements is implemented with a transmission line configured to provide a desired amount of delay.

7. The device of claim 6 wherein each of the transmission lines is one of a microstip, meanderline, or waveguide.

8. The device of claim 1 wherein each of the compensation delay elements includes one or more logic gates configured to provide a desired amount of delay.

9. The device of claim 8 wherein each of the compensation delay elements further includes one or more multiplexers.

10. The device of claim 1 wherein the device is included in a system-on-chip configuration.

11. A digital-to-analog converter device, comprising:
a plurality of current sources;
a plurality of switches, each operatively coupled between a corresponding one of the current sources and a summing junction that is operatively coupled to an analog output;
a plurality of switch control lines configured to receive a digital input, each switch control line for controlling a corresponding one of the switches; and
a plurality of compensation delay elements, each associated with a corresponding one of the switch control lines and providing a different delay value, wherein each of the compensation delay elements is implemented with a transmission line configured to provide a desired amount of delay;
wherein the summing junction is associated with parasitic delay that causes a plurality of unequal delay paths between the digital input and the analog output, and the compensation delay elements equalize those delay paths within a given tolerance, so that all switching caused by the digital input impacts the analog output substantially simultaneously.

12. The device of claim 11 wherein all switching caused by the digital input impacts the analog output within a window of 100 femtoseconds or less.

13. The device of claim 11 wherein all switching caused by the digital input impacts the analog output within a window of 400 femtoseconds or less.

14. The device of claim 11 wherein all switching caused by the digital input impacts the analog output within a window of 200 femtoseconds or less.

15. The device of claim 11 wherein each of the transmission lines is a microstip.

16. A digital-to-analog converter device having a digital input and an analog output, comprising:
a plurality of switch control lines associated with the digital input and configured to receive a digital input signal; and
a plurality of compensation delay elements, each associated with a corresponding one of the switch control lines and providing a different delay value, wherein the compensation delay elements equalize unequal delay paths between the digital input and the analog output within a given tolerance, so that all switching caused by the digital input impacts the analog output substantially simultaneously.

17. The device of claim 16 wherein all switching caused by the digital input impacts the analog output within a window of 100 femtoseconds or less.

18. The device of claim 16 wherein all switching caused by the digital input impacts the analog output within a window of 400 femtoseconds or less.

19. The device of claim 16 wherein all switching caused by the digital input impacts the analog output within a window of 200 femtoseconds or less.

20. The device of claim 16 wherein each of the compensation delay elements includes one or more logic gates and one or more multiplexers, and is configured to provide an adjustable amount of delay.

* * * * *